United States Patent
Lee et al.

(12) 
(10) Patent No.: US 6,277,707 B1
(45) Date of Patent: Aug. 21, 2001

(54) METHOD OF MANUFACTURING SEMICONDUCTOR DEVICE HAVING A RECESSED GATE STRUCTURE

(75) Inventors: Brian R. Lee; Gayle W. Miller; Kunal N. Taravade, all of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/212,931

(22) Filed: Dec. 16, 1998

(51) Int. Cl.7 .......................... H01L 21/76; H01L 21/336
(52) U.S. Cl. ..................... 438/430; 438/270; 438/272; 438/294; 438/296
(58) Field of Search ................................. 438/268, 270, 438/272, 294, 296, 334, 424, 430, 689, 959

(56) References Cited

U.S. PATENT DOCUMENTS

| | | |
|---|---|---|
| 4,663,832 | 5/1987 | Jambotkar ........................ 29/576 |
| 4,818,725 | 4/1989 | Lichtel, Jr. et al. . | |
| 5,175,122 | 12/1992 | Wang et al. . |
| 5,422,289 | 6/1995 | Pierce . |
| 5,459,096 | 10/1995 | Venkatesan et al. . |
| 5,492,858 | 2/1996 | Bose et al. . |
| 5,494,857 | 2/1996 | Cooperman et al. . |
| 5,627,094 | 5/1997 | Chan et al. ......................... 438/253 |
| 5,702,977 | 12/1997 | Jang et al. . |
| 5,733,810 | * 3/1998 | Baba et al. ......................... 438/268 |
| 5,763,310 | * 6/1998 | Gardner ............................ 438/270 |

* cited by examiner

*Primary Examiner*—Matthew Smith
*Assistant Examiner*—Lex H. Malsawma

(57) ABSTRACT

A method of forming a semiconductor device on a substrate including the steps of: forming a first recess in the substrate; depositing an insulator in the first recess so that an isolation region is formed when the first recess is filled with the insulator; forming a second recess in a predetermined area of the substrate; forming a recess insulation layer on the surface of the second recess; depositing a conductive material on the recess insulation layer and in the second recess so that a gate region is formed when the second recess is filled with the conductive material; removing a sufficient amount of the insulator and the conductive material so that the top surfaces of the insulator, the conductive material and the substrate are substantially at the same level.

28 Claims, 7 Drawing Sheets

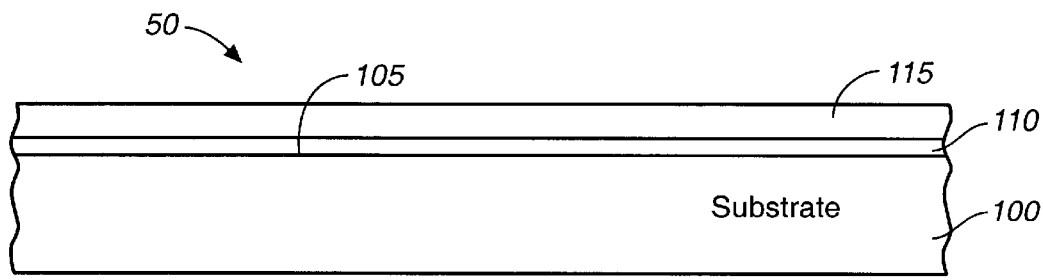
FIG._1
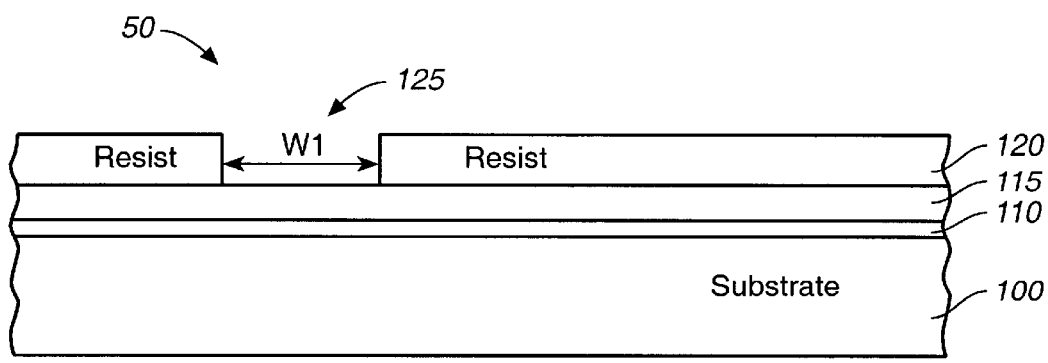
FIG._2
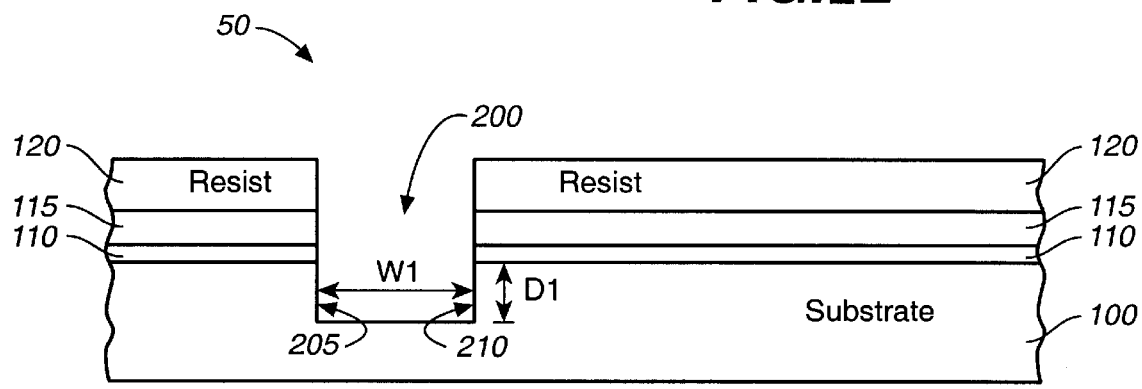
FIG._3
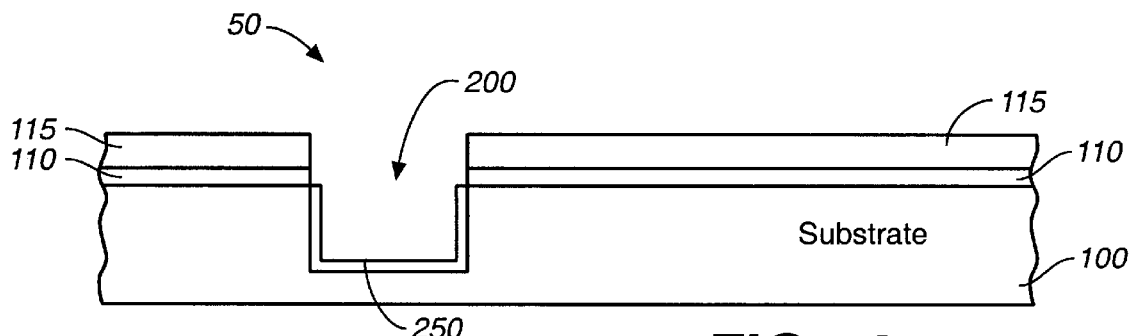
FIG._4

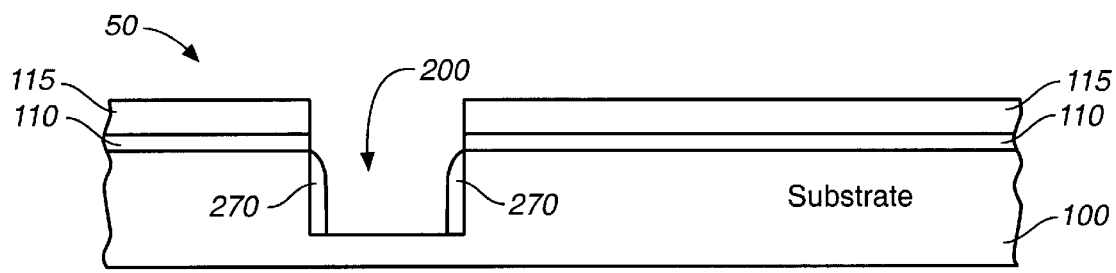
FIG._5
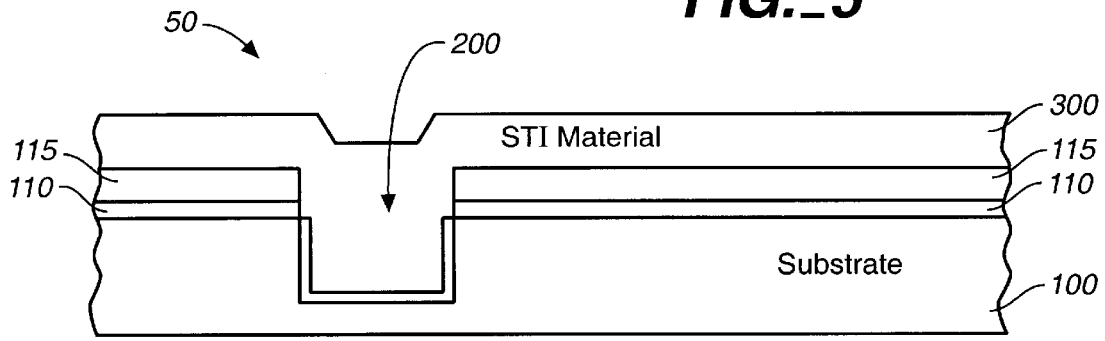
FIG._6
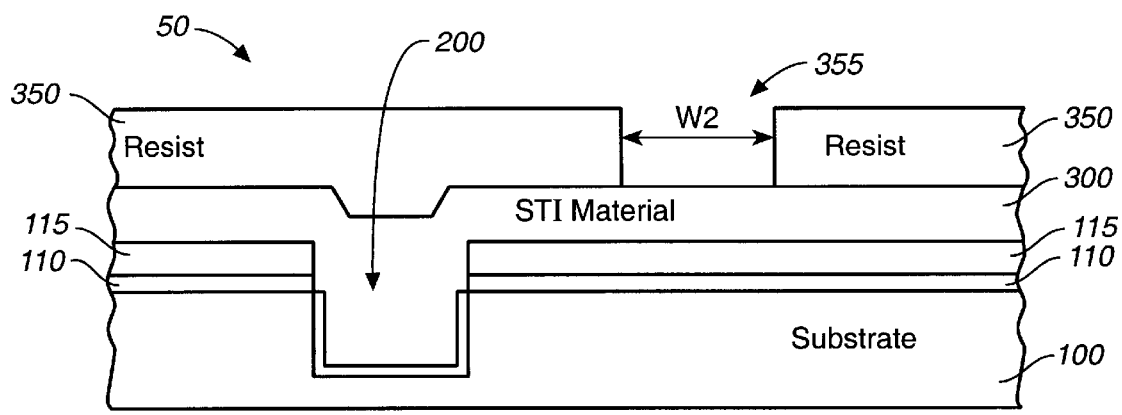
FIG._7
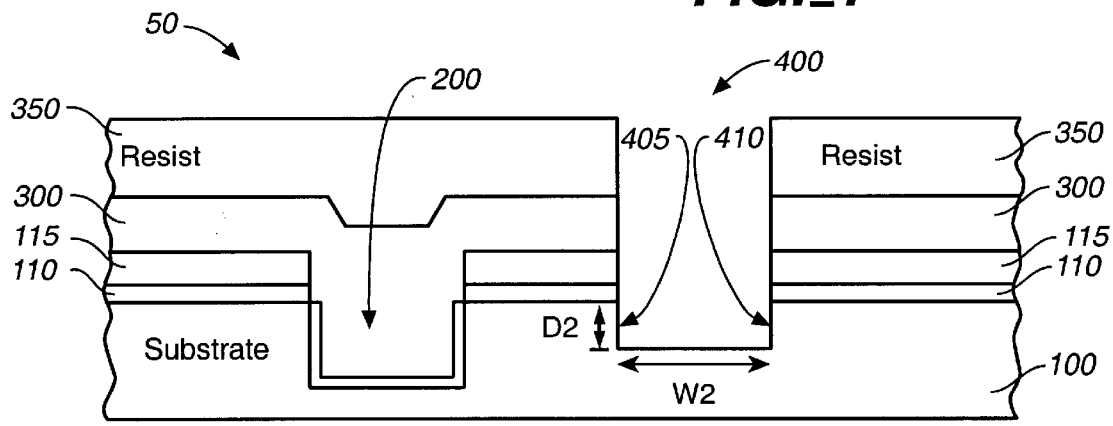
FIG._8

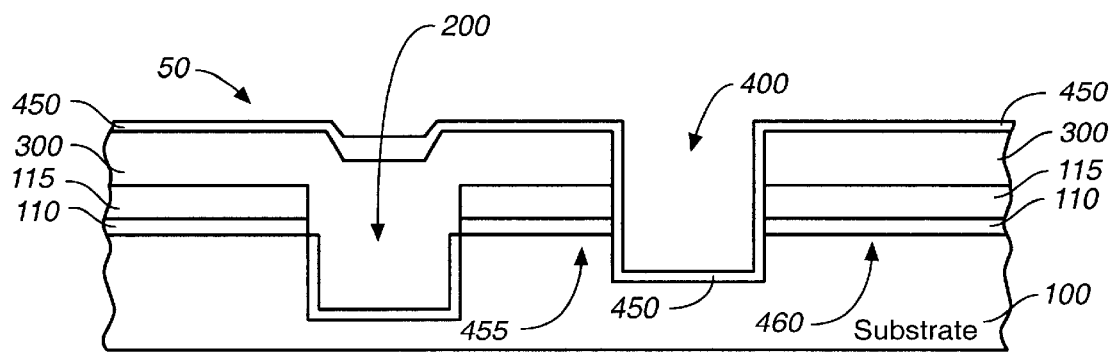
FIG._9
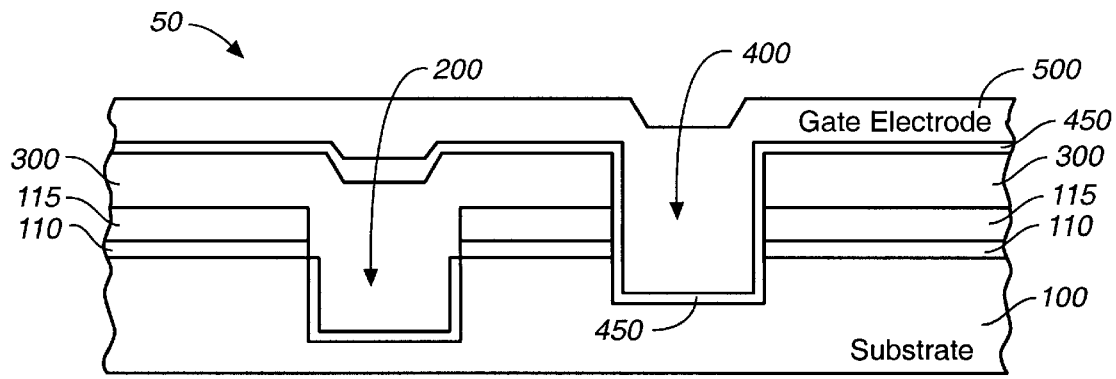
FIG._10
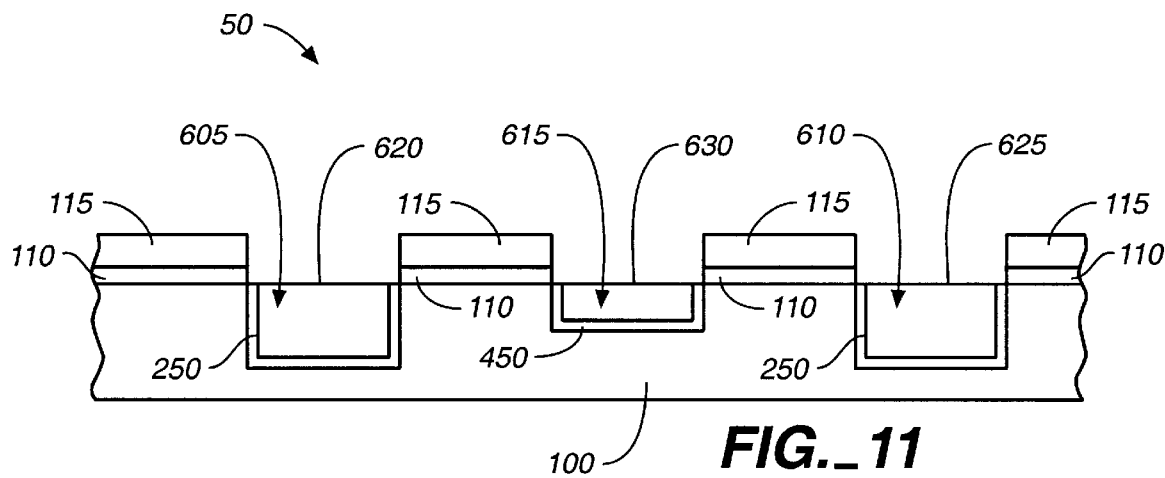
FIG._11

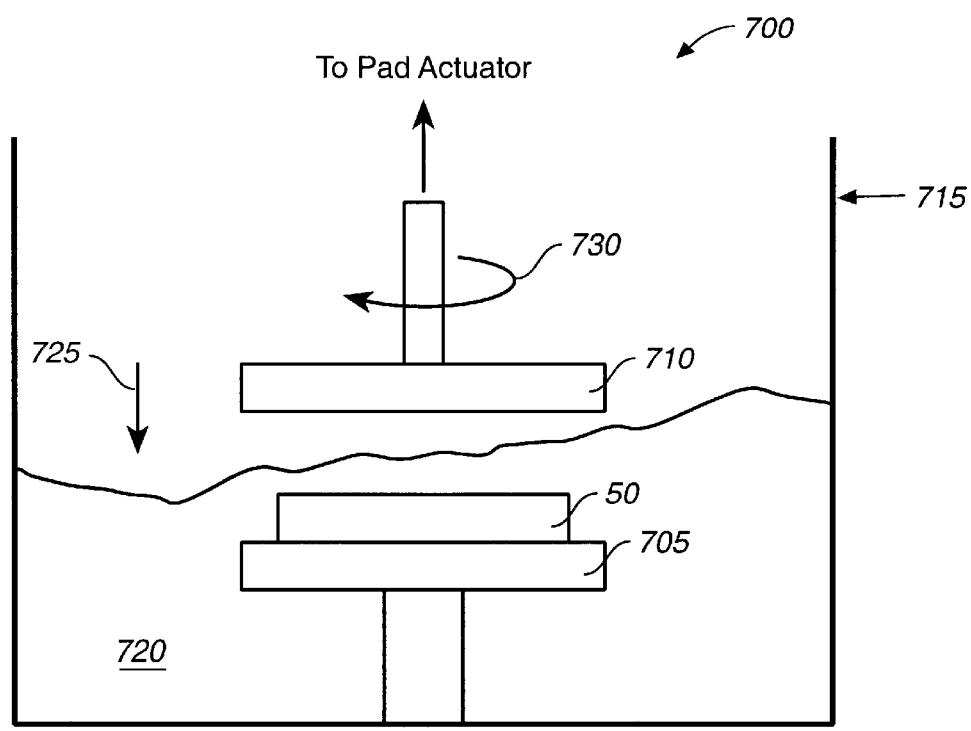
FIG._12  Polishing Apparatus
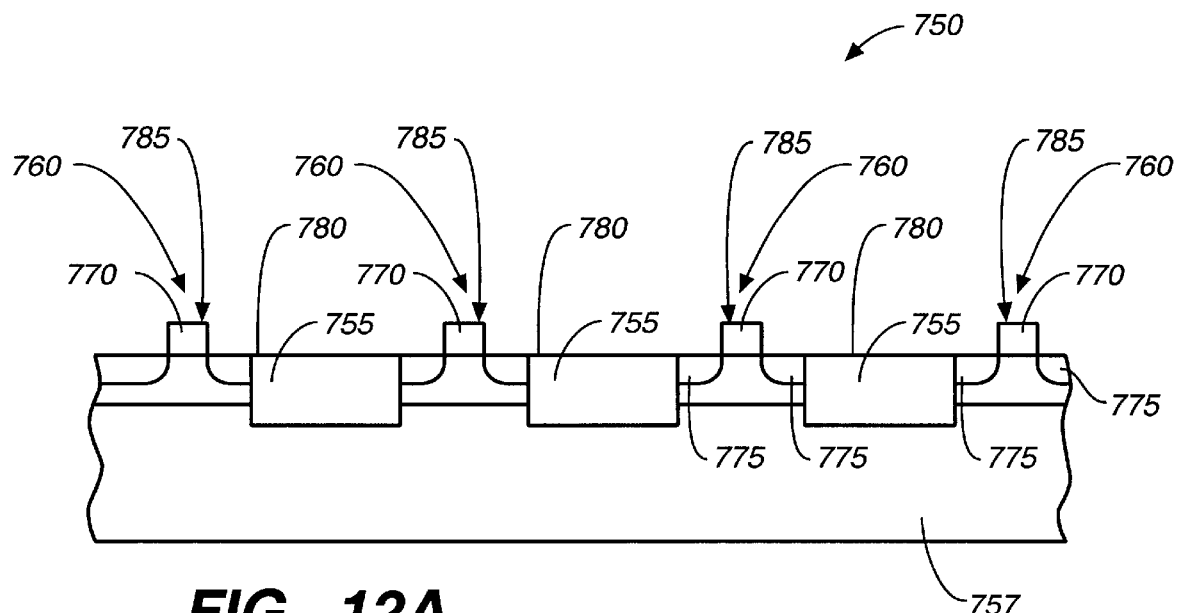
FIG._12A
*(PRIOR ART)*

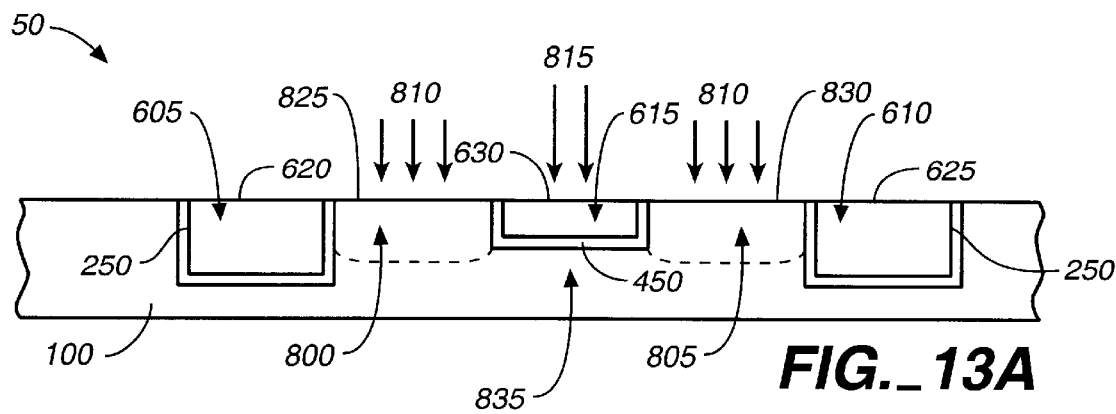
FIG._13A
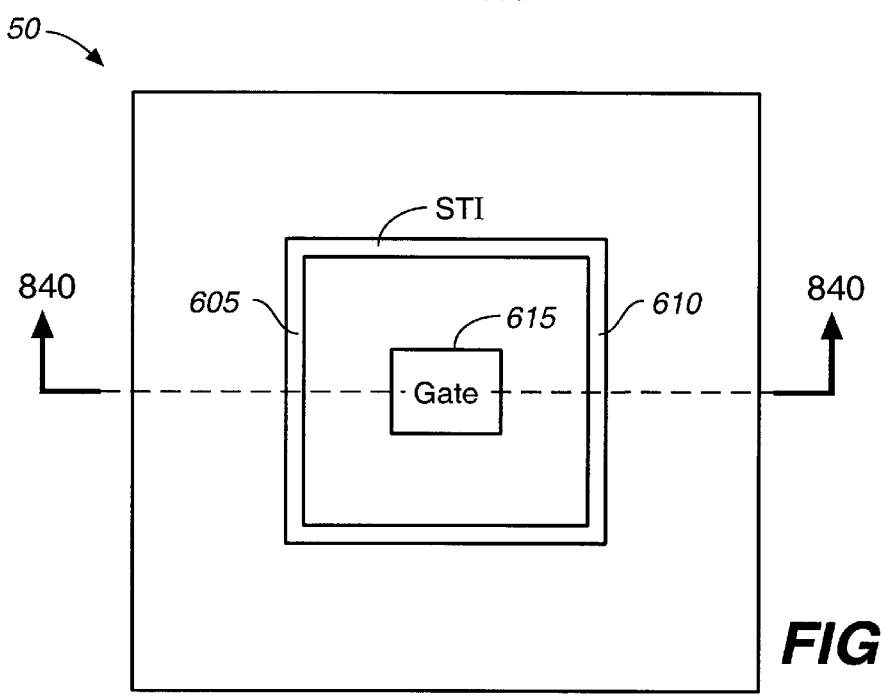
FIG._13B
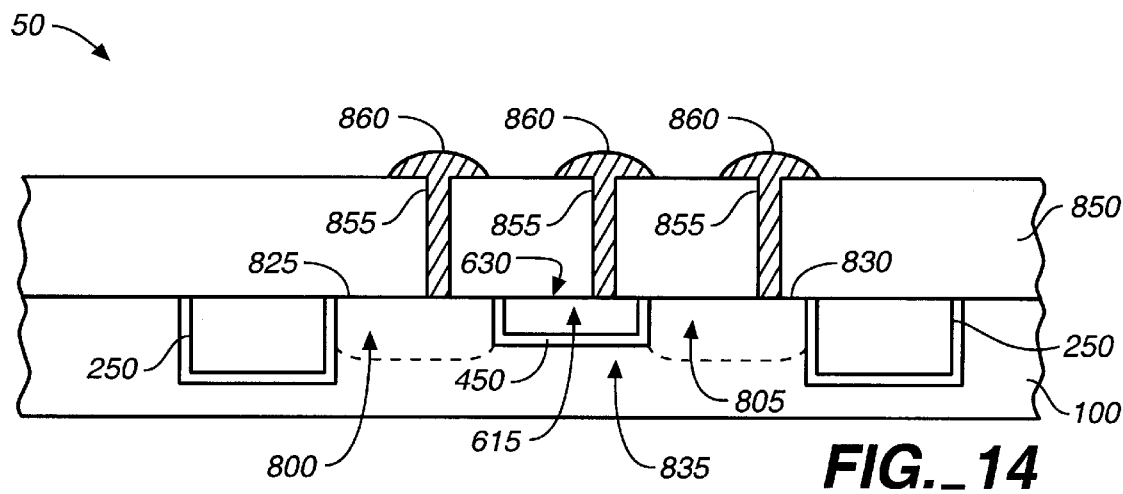
FIG._14

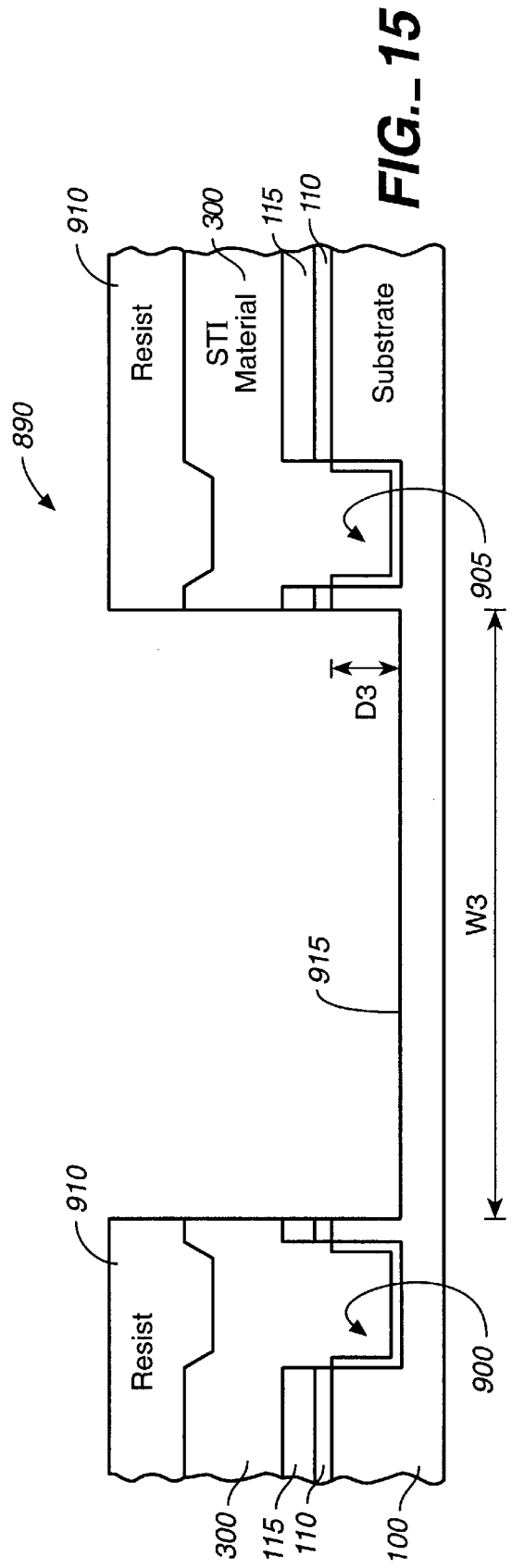
FIG._15
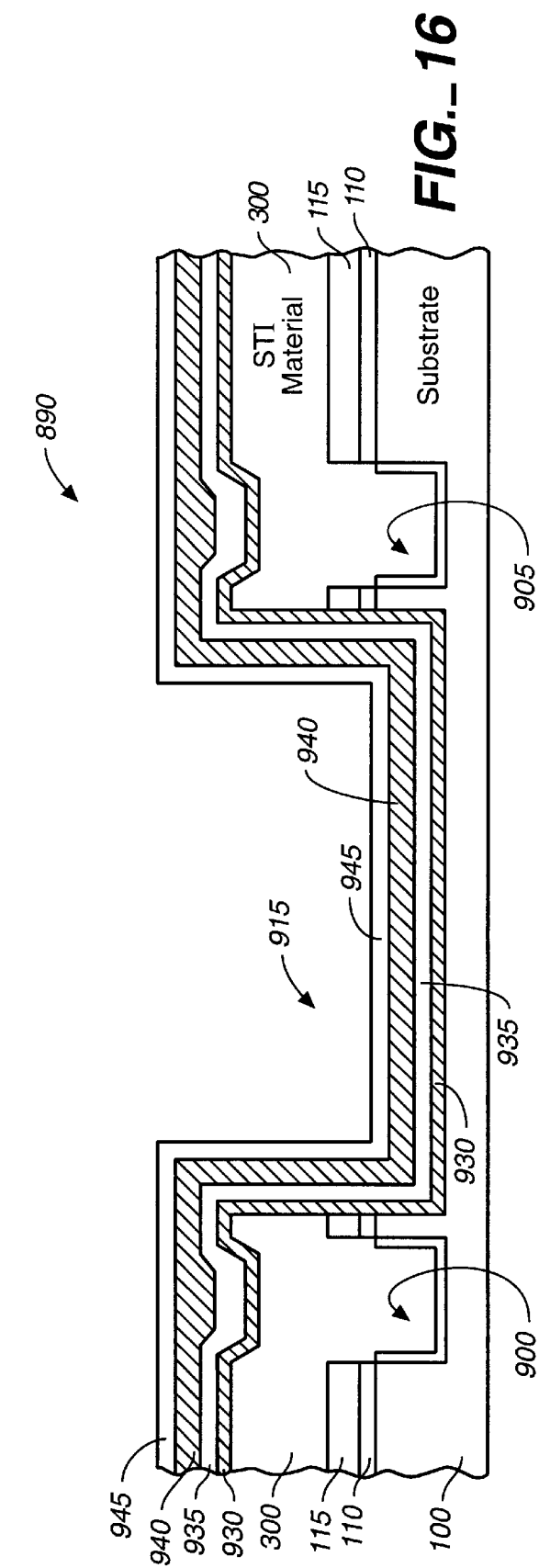
FIG._16

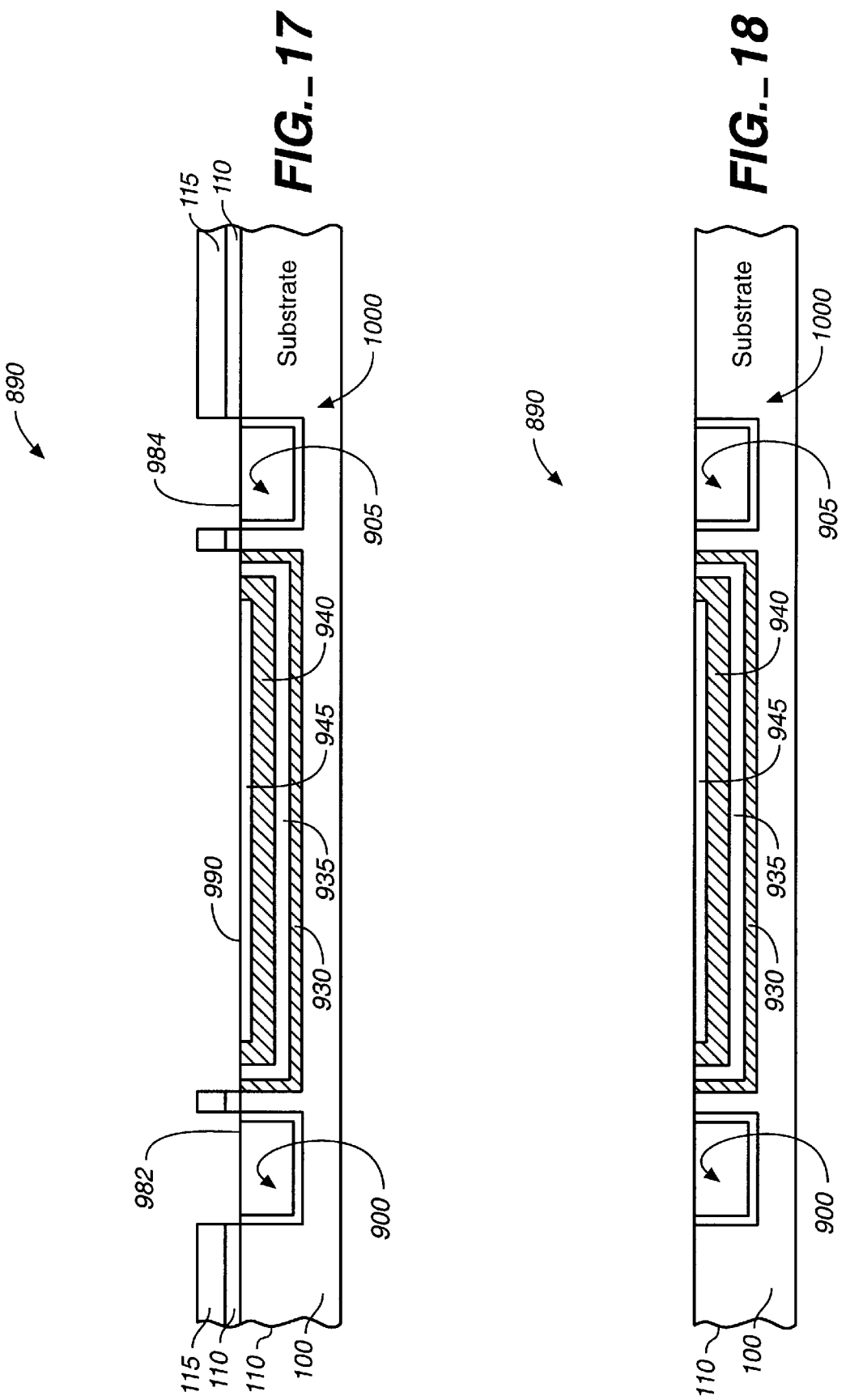

US 6,277,707 B1

METHOD OF MANUFACTURING SEMICONDUCTOR DEVICE HAVING A RECESSED GATE STRUCTURE

BACKGROUND

1. Field of the Invention

This invention relates generally to the field of semiconductor device fabrication and more specifically to the fabrication of a semiconductor device having a recessed gate.

2. Background of the Invention

As integrated circuit technology advances and integrated circuit device dimensions decreases, it has become increasingly common to employ trench isolation methods to form trench isolation regions between active regions of a semiconductor device. Such trench isolation methods may employ chemical mechanical polishing (CMP) to provide a nominally planarized surface for an isolation trench that has been filled with an insulator. Typically, a CMP planarization of a wafer involves holding the wafer against a rotating polishing pad that is subjected to a silica-based alkaline slurry. The polishing pad also applies pressure against the wafer.

While it is desirable to use CMP planarization during the fabrication of semiconductor devices, the CMP planarization step may present some problems and drawbacks. For example, each additional CMP step leads to additional costs and additional processing time in the semiconductor fabrication process.

Additionally, a CMP step on a newly formed layer on the wafer may cause alignment targets thereon to lose their steps after the CMP method is performed. The CMP planarization step may also lead to "over polishing" (i.e., removal of material that was not intended to be removed). All of the above results may contribute to defective devices, loss of device yield, and lack of device reliability.

In prior art semiconductor devices having the elevated source/drain configuration, a CMP step is typically required to planarize the isolation regions. Furthermore, an additional CMP step (i.e., a pre-contact CMP step) is required to planarize the surfaces of the gates in these prior art devices before forming the contacts on the gate and source/drain region surfaces. This additional CMP step can lead to the problems mentioned above.

Thus, there is a need for a semiconductor device that can be fabricated with a reduction in the number of CMP planarization steps. What is further needed is a method of fabricating a semiconductor device with a reduction in the number of CMP planarization steps in the fabrication process.

SUMMARY OF THE INVENTION

The present invention advantageously provides a method of manufacturing a semiconductor device wherein the method eliminates the pre-contact chemical mechanical polishing (CMP) step that is required in the prior art.

The present invention provides an additional advantage of being able to planarize both the surfaces of isolation regions and the surfaces of gate regions in a single CMP step.

By reducing the number of CMP steps, the present invention further permits a reduction in cost and in processing time. The invention can also avoid or reduce CMP step problems that lead to defective devices, loss of device yield, and lack of device reliability.

The invention also advantageously provides a gate surface that is substantially at the same level as the surfaces of the source/drain regions, thereby facilitating the formation of electrical connections during the contact etching and formation process.

The invention also advantageously provides a structure that permits the source/drain regions to be doped at a sufficient level so as to reduce the fusion impurities that degrade the transistor characteristics.

The present invention provides the above advantages, as well as others, through a method of forming a semiconductor device on a substrate. The method comprises the steps of: forming a first recess in the substrate; depositing an insulator in the first recess so that an isolation region is formed when the first recess is filled with the insulator; forming a second recess in a predetermined area of the substrate; forming a recess insulation layer on the surface of the second recess; depositing a conductive material on the recess insulation layer and in the second recess so that a gate region is formed when the second recess is filled with the conductive material; removing a sufficient amount of the insulator and the conductive material so that the top surfaces of the insulator, the conductive material and the substrate are substantially at the same level.

BRIEF DESCRIPTION OF THE DRAWINGS

FIG. 1 is a partial side view of a wafer cross section (including a substrate) prior to the formation of shallow trench isolation regions in the substrate according to the present invention;

FIG. 2 is a partial side view of the wafer in FIG. 1 whereby a resist layer defines the locations and dimensions of shallow trench isolation regions that are to be formed in the substrate according to the present invention;

FIG. 3 is a partial side view of the wafer in FIG. 1 whereby a trench is formed within the substrate so that a shallow trench isolation region is formed in the substrate according to the present invention;

FIG. 4 is a partial side view of the wafer in FIG. 1 whereby an insulation layer is formed in a trench for forming an isolation region according to the present invention;

FIG. 5 is a partial side view of the wafer in FIG. 1 whereby spacers are formed on the sidewalls of a trench for forming an isolation region according to the present invention;

FIG. 6 is a partial side view of the wafer in FIG. 1 whereby the trench is filled with an insulator (shallow trench isolation material) according to the present invention;

FIG. 7 is a partial side view of the wafer in FIG. 1 whereby a resist layer is formed for defining the location of a recessed gate structure in accordance with a preferred embodiment of the present invention;

FIG. 8 is a partial side view of the wafer in FIG. 1 whereby a gate trench region is formed in the substrate so that the gate trench region will provide a recessed gate structure in accordance with a preferred embodiment of the present invention;

FIG. 9 is a partial side view of the wafer in FIG. 1 whereby an insulation layer is formed on the surface of a gate trench region according to the present invention;

FIG. 10 is a partial side view of the wafer in FIG. 1 whereby a gate trench region is filled with a gate electrode (conductive) material according to the present invention;

FIG. 11 is a partial side view of the wafer in FIG. 1 whereby the surfaces of a shallow trench isolation region and a recessed gate are planarized by chemical mechanical polishing according to the present invention;

FIG. 12 is a side view of a chemical mechanical polishing system for planarizing the surface of the wafer in FIG. 11;

FIG. 12A is a partial view of a prior art semiconductor device with an elevated gate structure;

FIG. 13A is a partial side view of the wafer in FIG. 1 whereby ions are implanted in a recessed gate and in the substrate so that conductive regions are formed in the recessed gate and in the substrate according to the present invention;

FIG. 13B is a top view of a portion of the wafer in FIG. 13A; and

FIG. 14 is a partial side elevational view of the wafer in FIG. 13A whereby conductive contacts are coupled to a recessed gate and to source/drain regions in the substrate according to the present invention.

FIG. 15 is a partial side view of a wafer cross section (including a substrate with isolation regions) prior to the formation of a recessed capacitor according to the present invention;

FIG. 16 is a partial side view of the wafer in FIG. 15 whereby capacitor electrodes and a capacitor dielectric layer are formed within the substrate trench according to a method of the present invention;

FIG. 17 is a partial side view of the wafer in FIG. 16 whereby the surfaces of the shallow trench isolation regions and the recessed capacitor are planarized by chemical mechanical polishing according to a method of the present invention; and FIG. 18 is a partial side view of the wafer in FIG. 17 after the formation of the recessed capacitor and after the removal of the protective layer and the buffer layer on the substrate.

Detailed Description of the Preferred Embodiments

Referring in detail now to the drawings wherein similar parts or steps of the present invention are identified by like reference numerals, FIG. 1 illustrates a cross section of a wafer 50 that includes a semiconductor substrate 100 with a surface 105. Upon completion of the fabrication process, the wafer 50 will ultimately contain many integrated circuit chips. A buffer layer 110 is grown on the surface 105 of the substrate 100, and a protective layer 115 is deposited on the buffer layer 110. The buffer layer 110 serves as an adhesive and as a stress-reducing layer between the substrate 100 and the protective layer 115. Therefore, the buffer layer 110 serves to protect the substrate 100 from the protective layer 115 if the protective layer 115 is a material that will cause damage to the substrate 100 upon contact with the substrate 100. Alternatively, the buffer layer 110 is not required between the protective layer 115 and the substrate 100 if the protective layer 115 is formed from oxynitride.

The buffer layer 110 can be a doped or undoped oxide layer, and is typically formed by thermal oxidation under relatively high pressure conditions ranging from about 1e–6 atmospheres to about 1e–8 atmospheres, preferably from about 5e–7 atmospheres to about 8e–7 atmospheres. The oxide growth takes place at a temperature ranging from about 300 C to about 5000 C, preferably about 400 C, and lasts for a duration ranging from about 0.5 minutes to about 2 minutes, preferably from about 50 seconds to about 55 seconds. Typically, the thickness of the oxide layer 110 ranges from about 5000 Angstroms to about 7000 Angstroms, preferably from about 6000 Angstroms to about 6500 Angstroms. The buffer layer 110 may also be formed from an organically-based material such as spin-on glass.

Alternatively, the buffer layer 110 may be deposited on the surface 105 by other well known methods such as chemical vapor deposition (CVD), physical vapor deposition (PVD) sputtering methods, or by a photolithographic patterning of a blanket of pad oxide layer that is deposited on the surface 105.

The protective layer 115 is capable of blocking oxide and serving as a polish stop during a chemical mechanical polishing step, as described hereinbelow. The protective layer 115 is typically formed from silicon nitride. However, other suitable materials may be used as well to form the protective layer 115, including dielectric materials such as boron nitride, boron oxynitride, oxynitride, silicon-rich silicon nitride, polysilicon, and/or other suitable materials or combinations of materials. A protective layer 115 formed from silicon nitride may be deposited by chemical vapor deposition (CVD) under pressure conditions ranging from about 1e–4 atmospheres to about 1e–6 atmospheres, preferably from about 5e–4 atmospheres to about 5e–5 atmospheres, at a temperature ranging from about 300 C to about 500 C, preferably about 400 C. The thickness of the protective layer 115 ranges from about 500 Angstroms to about 1500 Angstroms, preferably from about 1000 Angstroms to about 1200 Angstroms.

As shown in FIG. 2, a resist layer 120 (i.e., a photoresist or photomask) is selectively formed on the protective layer 115 and thus serves as an etch mask. The resist layer 120 is first deposited on the protective layer 115 and then exposed to light through a photolithographic mask (reticle) that defines a pattern of trench (recess) regions, including trench region (recess) 200. The resist layer 120 is thus selectively formed on the protective layer 115, as shown in FIG. 2. A narrow hole opening 125 is formed in the resist layer 120 wherein the narrow hole opening 125 has a width WI of, for example, about 0.5 micron-meters. The narrow hole opening 125 corresponds to an intended isolation region to be formed in the substrate 100, as described hereinbelow. It is understood that the narrow hole opening 125 and other openings of various sizes are formed on the resist layer 120 as a result of the pattern of trench regions that are defined in the photolithographic mask (reticle). As shown in FIG. 3, the width W1 will also be the width of a corresponding trench region 200 to be formed in the substrate 100.

The resist layer 120 may be any suitable layer of material (s) capable of protecting any underlying material (e.g., the protective layer 115) from being etched during an etching process. Suitable materials for the resist layer 120 include materials having novolac resin and a photoactive dissolution inhibitor. The resist layer 120 may have any suitable thickness. The thickness of the resist layer 120 typically ranges from about 0.8 micron-meters to about 1.5 micron-meters, and preferably ranges from about 1 micron-meters to about 1.15 micron-meters. The resist layer 120 is preferably disposed on the protective layer 115 by the spin coating method.

An etching process is then carried out to form a plurality of trench regions in substrate 100 areas that are not covered by the resist layer 120. In FIG. 3, only the trench region 200 is shown for purposes of explaining the functionality of the present invention. The trench region 200 will eventually form an isolation region between active areas on the substrate 100, and may have a depth DI in the substrate 100 ranging from about 3000 Angstroms to about 5000 Angstroms, preferably from about 3500 Angstroms to about 3900 Angstroms. Preferably, the sidewalls 205 and 210 of the trench region 200 are substantially vertical.

A dry anisotropic etch, for example, may be used to form the precise pattern of the trench region 200 in the substrate 100. An etchant comprising $CF_4$ gas may be used, with the etch rate ranging from about 3000 Angstroms/minute to about 6000 Angstroms/minute, preferably from about 4500 Angstroms/minute to about 5000 Angstroms/minute. The flow rate of the above $CF_4$ etchant gas ranges from about 100 standard cubic centimeters per minute (sccm) to about 500 sccm, preferably from about 200 sccm to about 300 sccm. A preferred ion density for a plasma of the above etchant gas is about 1 E 10 atoms/cm$^3$. Other suitable etchants may also be selected from the following gases or mixtures thereof, such as $CHF_3$, NF3 or a mixture of CHF3 and CF4.

In FIG. 4, the resist layer 120 has been removed. The resist layer 120 is removed in any suitable manner, for example, by using oxygen plasma ashing and careful wet cleans. In removing the resist layer 120, a suitable plasma processing apparatus for performing the plasma etching may employ a microwave downstream O2/N2 plasma with the following parameters: 120 seconds, 250 degrees Celsius, 1400 Watts, 3000cc O2, 300cc N2, and 2.0 Torr.

With continuing reference to FIG. 4, after forming the trench region 200, a dielectric liner 250 is formed overlying the surface of the trench region 200. As an example, the dielectric liner 250 is a high-density silicon dioxide material formed by thermal oxidation and is capable of preventing the encroachment into the substrate 100 by a material (e.g., oxide) to be deposited in the trench region 200. For example, a dielectric liner 250 is formed by thermal oxidation under pressure conditions ranging from about 1e–4 atmospheres to about 1e–8 atmospheres, preferably from about 1e–5 atmospheres to about 1e–7 atmospheres. The thermal oxidation takes place at a temperature ranging from about 300 C to about 700 C, preferably about 500 C and lasts for a duration ranging from about 30 seconds to about 120 seconds, preferably from about 45 seconds to about 55 seconds.

The dielectric liner 250 can have a thickness ranging from about 700 Angstroms to about 2000 Angstroms and have a preferred thickness of about 1000 Angstroms. Assuming the dielectric liner 250 is a material formed from a high-density silicon dioxide layer, the dielectric liner 250 is etched initially by any suitable method, such as anisotrophic etching, so that the dielectric liner 250 is disposed along the surfaces of the trench regions 200, as best shown in FIG. 4. If anisotropic etching is used to shape a dielectric liner 250 formed from the above material, then an etchant comprising CF4 gas is preferably used, at a preferred flow rate ranging from about 50 sccm to about 200 sccm. A preferred ion density for a plasma of the above etchant gas is about 1E 10 atoms/cm$^3$.

Alternatively and as best shown in FIG. 5, dielectric spacers 270 are formed in the sidewalls of the trench region 200 to prevent lateral encroachment into the substrate 100 by a material (e.g., oxide) to be deposited in the trench region 200. Typically, the dielectric spacers 270 are formed from nitride which is first deposited in the trench region 200 and then etched into the dielectric spacers 270 shown in FIG. 5 by use of a reactive ion etch using nitrogen trifluoride (NF3) plasma. The NF3 etchant will have a preferred flow rate ranging from about 50 sccm to about 75 sccm, and have a preferred plasma ion density of about 1E 15 atoms/cm$^3$. The dielectric spacers 270 can each have a thickness ranging from about 1000 A to about 2000 and have a preferred thickness of about 1500 A. Alternatively, the dielectric liner 250 (and/or the dielectric spacers 270) may be omitted from the trench region 200.

In FIG. 6, the trench region 200 is filled with a shallow trench isolation (STI) material 300. The STI material 300 is a field oxide that is grown by thermal oxidation under pressure conditions ranging from about 1e–4 atmospheres to about 1e–7 atmospheres, preferably from about 1e–5 atmospheres to about 1e–6 atmospheres, at a temperature ranging from about 300 C to about 500 C, preferably about 400 C. The duration of the thermal oxidation process lasts for a duration between about 30 seconds to about 60 seconds preferably between about 40 seconds to about 50 seconds. The chosen temperature and thermal oxidation time length are dependent on the desired thickness, physical results and electrical results of the STI material 300.

Other conditions that must be controlled during the above thermal oxidation process are the gas flows and the gas ratios. For example, the ratio of O2 to SiH4 at 5 is preferred, while the flow rates of O2 and SiH4are preferably 30 sccm and 100 sccm, respectively.

Alternatively, the STI material 300 may be formed from a dielectric such as silicon dioxide deposited by, for example, CVD using a tetraethylorthosilane (TEOS) source gas. The STI material 300 may alternatively be formed from silicon dioxide that is deposited by an atmospheric deposition process. Other suitable materials (e.g., polyimide) may be used for the STI material 300 so that the trench region 200 is capable of serving as an isolation region.

The STI material 300 may be of any suitable thickness so that the trench region 200 is filled with the STI material 300. The thickness of the STI material 300 typically ranges from about 4000 to about 8000, and preferably ranges from about 6000 to about 7000.

As shown in FIG. 7, a resist layer 350 is selectively formed on the STI material 300 and thus serves as an etch mask that defines an etching pattern and location for the recessed gate structure 615 (FIG. 11) in accordance with the present invention. Similar to the resist layer 120 (FIG. 3), the resist layer 350 may be any suitable layer of material(s) capable of protecting any underlying material (e.g., the STI material 300) from being etched during an etching process. A narrow hole opening 355 is formed in the resist layer 350 by use of photolithographic methods wherein the narrow hole opening 355 corresponds to an intended location of a gate trench 400 (see FIG. 8) to be formed in the substrate 100, as described hereinbelow. The narrow hole opening 355 has a width W2 of, for example, about 0.25 micron-meters. As shown in FIG. 8, the width W2 will also be the width of a corresponding gate trench region (recess) 400 to be formed in the substrate 100.

The resist layer 350 may have any suitable thickness. The thickness of the resist layer 350 typically ranges from about 0.6 micron-meters to about 1 micron-meters, and preferably ranges from about 0.7 micron-meters to about 0.8 micron-meters. The resist layer 350 is preferably disposed on the STI material 300 by the spin coating method.

As shown in FIG. 8, the gate trench region 400 (and other gate trench regions) are etched in areas that are not covered by the resist layer 350. For example, the gate trench region 400 in FIG. 8 may have a depth D2 in the substrate 100 ranging from about 0.15 micron-meters to about 0.3 micron-meters and a length ranging from about 0.2 micron-meters to about 0.275 micron-meters. Preferably, the gate trench region 400 is formed so that the sidewalls 405 and 410 are substantially vertical within the substrate 100. To etch everything except region 100, gases CF4, CHF3 and Ar can be used. To etch region 100, use HCl and HBr.

Based on the teachings of the present invention herein, it will be appreciated by those skilled in the art that the materials that form the substrate 100, the buffer layer 110, the protective layer 115, and the STI material 300 may vary. Accordingly, a suitable etchant is chosen when forming the gate trench region 400, based upon the compositions of the substrate 100, the buffer layer 110, the protective layer 115, and the STI material 300. For example, in Table 1 assume that each of the following layers is formed by the corresponding material.

TABLE 1

| LAYER | MATERIAL |
|---|---|
| 100 | silicon with a (100) crystallographic orientation |
| 110 | oxide |
| 115 | nitride |
| 300 | oxide |

It is understood that the compositions of the layers 100, 110, 115 and 300 will dictate the proper etchant to be used and, in some instances, the power provided to the etcher. Based on the compositions of the layers indicated in Table 1, an etchant comprising about 50% volume of CF4 gas and 50% volume of CHF3 gas is used with the etch rate on layers 100, 110, 115, and 300 ranging from about 3000 Angstroms/minute to about 7000 Angstroms/minute, preferably from about 4000 Angstroms/minute to about 5000 Angstroms/minute. A preferred ion density for a plasma of the above etchant gases is about $1 E 10$ atoms/cm$^3$. The flow rate of the above first etchant gas CF4 ranges from about 100 sccm to about 300 sccm, preferably from about 150 sccm to about 250 sccm. The flow rate of the above second etchant gas CHF3 ranges from about 25 sccm to about 100 sccm, preferably from about 50 sccm to about 75 sccm. The above etching process is further preferably performed based on the reactor conditions listed in Table 2.

TABLE 2

| reactor parameter | Broad | Preferred | Optimum |
|---|---|---|---|
| pressure | 1 to 10000 mT | 100 to 5000 mT | 1000 to 2000 mT |
| RF power | 200 to 1000 Watts | 500 to 900 Watts | 750 Watts |
| RF frequency | 1000 to 5000 Mhz | 3000 to 4000 MHz | 4000 MHz |
| temperature of wafer | 100 to 300 Celsius | 125 to 150 Celsius | 150 Celsius |
| rotational magnetic field | 1 to 100 Gauss | 10 to 75 Gauss | 40 to 60 Gauss |
| Magnetic Rotational Frequency: | 1 Hz to 10 Hz | 3–8 Hz | 5Hz. |

A suitable plasma processing apparatus for performing the above etching process is available, for example, a Centura MxP+ Chamber etch tool from Applied Materials, Santa Clara, Calif.

In FIG. 9, the resist layer 350 has been removed. The resist layer 350 may be removed by using oxygen plasma ashing and careful wet cleans or by other suitable methods. In removing the resist layer 350, a suitable plasma processing apparatus may employ a microwave downstream O2/N2 plasma with the following parameters: 120 seconds, 250 degrees Celsius, 1400 Watts, 3000 cc O2, 300 cc N2, and 2.0 Torr.

With continuing reference to FIG. 9, after forming the gate trench region 400, an insulation layer 450 is formed on the surface of the gate trench region 400. In FIG. 9, the insulation layer 450 is formed in the trench 400 as well as on the STI material 300. Alternatively, the insulation layer 450 may be formed entirely within the trench 400 by use of masking or etching methods, as conventionally know. The insulation layer 450 is, for example, an oxide material formed by thermal oxidation and is capable of preventing the encroachment into the substrate 100 by a gate electrode material 500 (see FIG. 10) to be deposited in the gate trench region 400. Thus, the insulation layer 450 will prevent the gate electrode material 500 (see FIG. 10) from encroaching into the substrate areas 455 and 460 wherein the substrate areas 455 and 460 will eventually become source/drain regions within the substrate 100.

Insulator layer 450 is preferably nitrided silicon dioxide, which is also called nitrided oxide for short, and is obtained by implanting conventional oxide with nitrogen gas under high vacuum of about 1e–3 Torr in an implant tool such as Eaton GSD series implanters. The etchant gases to etch this material will be the same as those for simple oxide. As an example, the insulation layer 450 can be formed from oxide by use of the thermal oxidation method under pressure conditions ranging from about 1e–5 atmospheres to about 1e–8 atmospheres, preferably from about 1e–6 atmospheres to about 1e–7 atmospheres. The thermal oxidation takes place at a temperature ranging from about 50 C to about 90 C, preferably about 75 C. Alternatively, the insulation layer 450 can be formed from oxide by use of CVD methods, PVD sputtering methods or by providing a blanket of pad oxide layer that is then subjected to photolithographic patterning. Other suitable materials may be used to form the insulation layer 450.

The insulation layer 450 is formed on the STI material 300 and on the surface of the gate trench region 400. The preferred thickness of the insulation layer 450 will depend on the spacing between the source/drain regions to be formed in the substrate regions 455 and 460, as determined by scaling laws which are discussed in Physics of Semiconductor Devices, $2^{nd}$ Edition, by S.M. Sze, Wiley Interscience Publication, Chapter 8, Section 8.5.1. For example, the insulation layer 450 can have a thickness ranging, for example, from about 35 Angstroms to about 75 Ansgtroms if the source/drain regions to be formed in substrate regions 455 and 460 are spaced apart by a distance of 0.25 microns.

In FIG. 10, the gate trench region 400 is filled with a gate electrode (conductive) material 500. The gate electrode material 500 is formed from any number of metals, metal alloys, semiconductors or doped semiconductors. Examples of suitable gate electrode materials include, but are not limited to polysilicon, polycides, polycrystalline, germanium, aluminum, aluminum with silicon and/or copper, aluminum with refractory metal compounds, and other metals or metal alloys. Other suitable conductive materials may also be used to form the gate electrode material 500.

Preferably, the gate electrode material 500 is formed from amorphous silicon material. The preferred material of amorphous silicon is deposited by, for example, CVD, under pressure conditions ranging from about 1e–5 atmospheres to about 1e–7 atmospheres, preferably from about 1e–6 atmospheres to about 3e–6 atmospheres, at a temperature ranging from about 530 C to about 575 C, preferably about 560 C. The gate electrode material 500 may be of any suitable thickness so that the gate trench region 400 is filled with the gate electrode material 500, as shown in FIG. 10. The thickness of the gate electrode material 500 above the insulation layer 450 typically ranges from about 2000 Angstroms to about 3000 Angstroms, and preferably ranges from about 2400 A to about 2600 A.

A dry anisotropic etch, for example, may be used to remove the layers 500 by using Cl2 and/or HBr gas as an etchant. Suitable etchants may be used as well to strip the layers 450, and 300 like . the following gases or mixtures: CF4, CHF3, Ar.

Based on the teachings of the present invention herein, it is appreciated by those skilled in the art that the materials that form the gate electrode 500, the insulation layer 450, and the STI material 300 may vary. Accordingly, a suitable etchant is chosen based upon the compositions of the gate electrode 500, the insulation layer 450, and the STI material 300. For example, in Table 3 assume each of the following layers are formed by a corresponding material.

TABLE 3

| LAYER | MATERIAL |
|---|---|
| 300 | High density oxide |
| 450 | nitrided oxide |
| 500 | polysilicon |

It is understood that the compositions of the layers 300, 450, and will dictate the proper type of etchant to be used and, in some instances, the power provided to the etcher. It is also noted that although different gases are used to etch the gate electrode and the other two oxide layers, the relative gas ratios and other parameters are about the same in the two types of etch chemistries, i.e. poly and oxide. Based on the compositions of the layers indicated in Table 3, an etchant comprising about 50% volume of $CHF_3$ gas and 50% volume of $CF_4$ gas is used with the etch rate ranging from about 500 Angstroms/minute to about 4000 Angstroms/minute, preferably from about 800 Angstroms/minute to about 1200 Angstroms/minute. A preferred ion density for a plasma of the above etchant gases is about 1E 10 atoms/cm$^3$. The flow rate of the above first etchant gas CHF3 ranges from about 25 sccm to about 75 sccm, preferably from about 50 sccm to about 60 sccm. The flow rate of the above second etchant gas CF4 ranges from about 25 sccm to about 100 sccm, preferably from about 50 sccm to about 75 sccm. The above etching process is further preferably performed based on the reactor conditions listed in Table 2 previously.

A suitable plasma processing apparatus for performing the above etching process is available, for example, a Centura MxP+ Chamber etch tool from Applied Materials, Santa Clara, Calif. The layers 500, 450, and 300 are stripped by etching, and etching is performed until the STI material 300 has been stripped from the protective layer 115. The result of the above etching step is the wafer 50 shown in FIG. 11.

In FIG. 11, etching has been performed so that the layers 300, 450 and 500 are removed, and the shallow trench isolation (STI) regions 605 and 610 have been formed. The STI regions 605 and 610 are filled with the STI material 300 (see, e.g., FIG. 6). The STI region 605 was formed from the trench region 200 (see FIG. 5), while the STI region 610 was formed from another trench region during the photolithographic and etching process discussed with reference to FIGS. 7 and 8. A recessed gate 615 is formed after the gate trench 400 (FIG. 9) is filled with the gate electrode 500.

Global planarization is then performed on the surfaces 620 and 625 of the STI regions 605 and 610, respectively, and on the surface 630 of the recessed gate 615. Global planarization is preferably performed by chemical mechanical polishing (CMP). Since the protective layer 115 has a slower polish rate than materials formed in the STI regions 605 and 610 and in recessed gate 615, the protective layer 115 will act as a polish stop.

FIG. 12 shows a polishing apparatus 700 for performing CMP on the wafer 50 in FIG. 11. The polishing apparatus 700 includes a table 705 for supporting the wafer 50, a pad 710 which is typically a polyurethane material, and a CMP container 715. The table 705 and the pad 710 are located within the container 715. The wafer 50 is placed on the table 705 and cooled to a temperature ranging from about 70 C to about 80 C, preferably about 75 C. A slurry 720 is introduced in the CMP container 715 at a flow rate ranging from about 3 ml/min to about 300 ml/min depending on the sequence of the polishing operation. Normal range of polishing time is between 2 and 3 minutes per wafer.

The pad 710 (which is driven by a CMP motor) is forced into contact with the wafer 50 in the direction of arrow 725, and is rotated as shown by arrow 730 so that the surfaces 620, 625 and 630 (FIG. 11) are polished. The polishing parameters and the polishing consumable items determine the final process characteristics. Table 4 lists examples of polishing parameters and consumables that permit the desired process characteristics.

TABLE 4

| | |
|---|---|
| platen (pad) pressure: | about 10 psi to about 25 psi |
| platen rotation speed: | about 20 rpm to about 75 rpm |
| table rotation speed: | about 10 rpm to about 30 rpm |
| platen temperature: | about 20 Celsius to about 30 Celsius |
| slurry composition: | Ammonium Hydroxide (NH$_4$OH) carrier in a proprietory composition |

After performing the CMP step, the protective layer 115 is removed using either a wet chemical etch or a dry plasma chemical etch. For example, if the protective layer 115 is nitride, then a plasma comprising nitrogen trifluoride (NF3) may be used as an etchant. If the buffer layer 110 is oxide, then removal of the buffer layer 110 may be performed by, for example, anisotropic etching using CHF3/CF4 gas.

The advantages of the present invention over conventional processing methods are now discussed with particular reference to FIG. 12A. A partial cross-sectional view of a conventional semiconductor device on a wafer 750 is shown with shallow trench isolation regions 755 formed in the substrate 757. Active regions 760 are formed on the substrate 757 wherein each active region 760 includes a gate 770 and source/drain regions 775. The prior art method requires a CMP step to be performed on the surface 780 of an isolation region 755. After formation of the gates 770 and after ions are implanted on the gates 770 and source/drain regions 775, the prior art method requires another CMP step (i.e., a pre-contact CMP step) on the surfaces 785 of the gates 770. After performing the pre-contact CMP step on the surfaces 785, contacts are then formed on the surfaces of the gates 770 and on the surfaces of the source/drain regions 775.

In contrasts, the present invention eliminates the pre-contact CMP step that is required in the prior art. In accordance with a method according to the present invention, the planarization of the STI regions (e.g., STI regions 605 and 610 in FIG. 11) and the planarization of the surface 630 of the recessed gate 615 are advantageously performed in a single CMP step, as discussed hereinabove. By eliminating the pre-contact CMP step as required in the prior art, the present invention can reduce the cost and processing time in the semiconductor fabrication process, and also avoid other problems that may arise as a result of performing the CMP step, as mentioned hereinabove.

FIG. 13A shows the wafer 50 after the protective layer 115 and the buffer layer 110 are removed. FIG. 13A is a cross-sectional view of the wafer 50 along the arrows 840, 840 as seen in FIG. 13B. A conventional annealing step may be performed as an option to densify the oxide materials in the STI regions 605 and 610.

The source/drain regions 800 and 805 are then formed by employing dopant species (as depicted by arrows 810) whereby the dopant species 810 are ionized and implanted into the substrate 100 at a sufficient velocity and dosage. The desired polarity for the source/drain regions 800 and 805 will dictate the polarity of the dopant species. Arsenic dopant species, boron dopant species, and phosphorous dopant species are commonly used for forming source/drain regions in a substrate. For example, to form N+ source/drain regions, N-type impurities (such as arsenic ions from As gas) may be implanted into the substrate 100 with an energy of about 80 KeV and with a dosage of about 2E 15 atoms/cm$^3$. P+ source/drain regions may be formed by implantation of P-type impurities (such as boron ions from $BF_2$ gas) with an energy of about 70 KeV and with a dosage of about 3E 15 atoms/cm$^3$. Additionally, ions 815 (such as Phosphorus type ions) are implanted into the recessed gate 615 at an energy of about 60 KeV and with a dosage of about 6E15 atoms/cm$^3$. Thus, the recessed gate 615 and the source/drain regions 800 and 805 will form an active region on the wafer 50. The thickness of the source/drain region 800 (or 805) is, for example, between about 1000 to about 5000 Angstroms.

The present invention provides an additional advantage during the contact etch process (i.e., contact formation process) (see FIG. 15), since the gate surface 630 is substantially at the same level as the surfaces 825 and 830 of the source/drain regions 800 and 805, respectively.

The requirements to maintain good linewidth control at different focal planes in the non-planar (prior art) case for source/drain and gate regions during contact lithography are eliminated. Also since the gate and source/drain regions are at the same level, the requirements for maintaining different etch rates to account for difference in step heights (prior art) are also eliminated, thus making the etch process also a lot simpler. The structure of the transistor 835 in FIG. 13A permits the source/drain regions 800 and 805 to be doped at a sufficient level so as to reduce the fusion impurities that degrade the transistor characteristics. By exposing only the top surface of the gate electrode (as opposed to top and side surfaces in prior art) the amount of surface area exposed to possible contamination by impurities is limited. This results in a "cleaner" manufacturing process.

FIG. 13B is a top elevational view of a portion of the wafer 50 after the protective layer 115 and the buffer layer 110 are removed. Only one gate region is shown in FIG. 13B for purposes of explaining the functionality of the present invention.

In FIG. 14, a thick dielectric layer 850, such as borophosphosilicate glass (BPSG), (or Tetra Ethyl Ortho-Silane-TEOS) is deposited by, for example, CVD, as conventionally known. The thickness of the dielectric layer 850 is, for example, between about 10000 Angstroms to about 15000 Angstroms. Contact openings 855 are then formed through the dielectric layer 850 where electrical connections are desired. A chemical or reactive ion etch may be used to form the contact openings 855, depending on the material that is used to form the dielectric layer 850. Conduction layers 860 are deposited to fill the contact openings 855 and are coupled to the source/drain regions 800 and 805 and/or the recessed gate 615. Therefore, the conduction layers 860 are patterned to complete the electrical connections of the electronic components formed on the wafer 50. Preferably, the conduction layers 860 are formed from the material of Tunsgten (W) by the Chemical Vapor deposition method, as conventionally known.

As shown in FIG. 14, the surface 630 of gate 615 and the surfaces 825 and 830 of the source/drain regions 800 and 805, respectively, are substantially at the same level. Thus, the structure of the transistor 835 is fully or substantially planar with a "damascene-like" gate feature. Since, the surfaces 630, 825, and 830 are substantially at the same level or substantially planar, the formation of the electrical connections between the conductors 860 and the surfaces 630, 825 and 830 is facilitated during the contact etching and formation steps Referring to FIG. 12A (prior art), the surfaces 785 (gate electrode) and 780 (S/D regions) are at different heights. During contact etch, this would mean making contact hole openings of different depths through the dielectric layer 850 in FIG. 15. That would necessitate maintaining different etch rates over the gate and source/drain regions so that the etch "stops" exactly over those regions after etching through different oxide thicknesses (with oxide thickness over source/drain region being greater than that over the gate electrode). This makes for a very difficult process and requires careful tuning of etch rates, and frequently results in either over etch or under etch. The present invention, by virtue of the fact that the gate and source/drain regions are at the same level, provides identical thicknesses of the dielectric layer 850 over them, thus eliminating the need to maintain different etch rates and protects the surfaces from over etch.

FIGS. 15–17 illustrate a method of forming a recessed capacitor on a wafer 890, in accordance with the present invention. Referring initially to FIG. 15, a plurality of isolation trenches (regions) 900 and 905 are formed and filled with STI material 300 in the same manner as described hereinabove. A resist layer 910 is then selectively formed on the STI material 300 and thus serves as an etch mask that defines an etching pattern for the recessed capacitor 1000 (FIG. 19) to be formed. A trench 915 is etched in an area not covered by the resist layer 910 and may have a depth D3 within the substrate 100 of, for example, about 0.5 micron and a width W3 of, for example, about 0.5 micron. The trench 915 may be formed by etching methods as discussed hereinabove, depending on the composition of the layers 100, 110, 115, and 300.

Referring now to FIG. 16, after removing the resist layer 910, a dielectric layer 930 is deposited in the trench 915. The dielectric layer 930 is preferably an oxide layer formed by thermal oxidation under pressure conditions typically ranging from about 1e–3 atmospheres to about 1e–5 atmospheres, preferably from about 1e–4 atmospheres to about 5e–4 atmospheres. The oxide growth takes place at a temperature typically ranging from about 300 C to about 600 C, preferably about 450 C and lasts for a duration typically ranging from about 0.5 minutes to about 1.0 minutes, preferably about 0.75 minutes. The thickness of a dielectric layer 930 formed from oxide typically ranges from about 4000 Angstroms to about 7000 Angstroms, preferably from about 4500 Angstroms to about 5500 Angstroms.

Alternatively, a dielectric layer 930 formed from oxide may be deposited by use of CVD methods, PVD sputtering methods or by providing a blanket of pad oxide layer that is then subjected to photolithographic patterning.

Other suitable materials may be used to form the dielectric layer 930. For example, any of the following materials or combinations thereof may be used to form the dielectric layer 930: TEOS, or BPTEOS (Boron-phosphorus TEOS).

A bottom electrode 935 is then deposited over the dielectric layer 930 and will form one of the electrodes of the recessed capacitor in accordance with the present invention. The bottom electrode 935 is preferably formed from polysilicon or metal. Other suitable conductive materials may be used as well, such as metal alloys. A bottom electrode 935 that is formed from polysilicon may be deposited by CVD under pressure conditions typically ranging from about 1e–5 atmospheres to about 1e–8 atmospheres, preferably from about 5e–6 atmospheres to about 5e–7 atmospheres, at a temperature ranging from about 600 C to about 800 C, preferably from about 650 C to about 700 C. If the bottom electrode 935 is formed from polysilicon, then the bottom electrode 935 may be deposited by a CVD process employing silane as the silicon source material along with a suitable quantity and type of dopant to make the bottom electrode 935 sufficiently conductive to serve as an electrode for the recessed capacitor 1000 (see FIG. 18). The thickness of the bottom electrode 935 typically ranges from about 2000 A to about 4000 A, preferably from about 2500 A to about 3500 A.

A capacitor dielectric 940 is then formed over the bottom electrode 935. The capacitor dielectric 940 is preferably a high dielectric constant insulator such as tantalum pentoxide (TaO5). However, other insulators could be used as well such as silicon nitride, plasma oxides, and other suitable insulators. The thickness of the capacitor dielectric 940 ranges, for example, from about 800 Angstroms to about 1500 Angstroms, although the thickness will vary according to the desired capacitive characteristics for the recessed capacitor 1000 (see FIG. 18) to be formed in accordance with the present invention. A capacitor dielectric 940 formed from TaOS may be deposited by CVD under pressure conditions typically ranging from about 1e–4 atmospheres to about 1e–7 atmospheres, preferably from about 5e–5 atmospheres to about 5e–6 atmospheres, at a temperature typically ranging from about 500 C to about 1000 C, preferably from about 600 C to about 850 C.

A top electrode 945 is then deposited over the capacitor dielectric 940 and will form the top electrode of the recessed capacitor 1000 (see FIG. 18) in accordance with the present invention. The top electrode 945 is preferably formed from polysilicon or metal. Other suitable conductive materials may be used as well, such as metal alloys. A top electrode 945 that is formed from polysilicon is preferably deposited by CVD deposition under pressure conditions typically ranging from about 1e–4 atmospheres to about 1e–7 atmospheres, preferably from about 5e–5 atmospheres to about 5e–6 atmospheres, at a temperature typically ranging from about 600 C to about 750 C, preferably from about 620 C to about 650 C. If the top electrode 945 is formed from polysilicon, then the top electrode 945 may be deposited by a CVD process employing silane as the silicon source material along with a suitable quantity and type of dopant to make the top electrode 945 sufficiently conductive to serve as an electrode for the recessed capacitor 1000 (see FIG. 18). Alternatively, the top electrode 945 may be made sufficiently conductive by ion implantation after the top electrode 945 is planarized. The thickness of the top electrode 945 typically ranges from about 2000 A to about 3000 A, preferably from about 2200 A to about 2600 A.

Polysilicon electrode layers are etched with $Cl_2$ and HBr. Oxide (and other dielectric) layers are etched using a mixture of one or more of the following gases: $CHF_3$, $CF_4$ and Ar. Other suitable etchants may be used as well. For example, the following etchant gases or mixtures thereof may be used to etch the layers 945, 940, 935 and 300:.

Based on the teachings of the present invention herein, it is appreciated by those skilled in the art that the materials that form the layers 945, 940, 935, 930, and 300 may vary. Accordingly, a suitable etchant is chosen based upon the compositions of the layers 945, 940, 935, 930, and 300. Layer 300 may be oxide, layer 935 implanted poly or amorphous silicon, layer 940 Tantalum Pentoxide or TEOS, and layer 945 implanted polysilicon, and the etchant is selected based upon the these material compositions. The above etching process is further preferably performed based on the reactor conditions listed in Table 2 previously.

A suitable plasma processing apparatus for performing the above etching process is available, for example, a Centura MxP+ Chamber etch tool from Applied Materials, Santa Clara, Calif. The layers 945, 940, 935, 930, and 300 are stripped by etching, and etching is performed until the STI material 300 has been stripped from the protective layer 115. The result of the above etching step is the wafer 890 in FIG. 17.

Global planarization is then performed on the wafer 890. For example, planarization is performed on the surfaces 982 and 984 of the STI regions 900 and 905, respectively, and on the surface 990 of the recessed capacitor 1000. The protective layer 115 and the buffer layer 110 serve as a polish stop if the above planarization step is performed by CMP.

In FIG. 18, the protective layer 115 and the buffer layer 110 have been removed in the same manner as discussed hereinabove. Additionally, a thick dielectric layer such as borophosphosilicate glass (BPSG), and contact openings and contacts, are then formed above the recessed capacitor 1000 to complete the electrical connections for the recessed capacitor 1000.

While the invention has been described in connection with what is presently considered to be the preferred embodiments, it is understood that the invention is not limited to the disclosed embodiments. For example, each of the features described above can be used singly or in combination, as set forth below in the claims, without other features described above which are patentably significant by themselves. Accordingly, the present invention is intended to cover various modifications and equivalent arrangements included within the spirit and scope of the appended claims.

What is claimed is:

1. A method of forming a semiconductor device on a substrate, comprising the steps of:

forming a first recess in the substrate;

depositing an insulator on the substrate and in the first recess so that an isolation region is formed when the first recess is filled with the insulator;

forming a second recess in a predetermined area of the substrate by removing a portion of the substrate in the predetermined area and a portion of the insulator disposed over the predetermined area;

forming a recess insulation layer on the surface of the substrate and in the second recess;

depositing a conductive material on the recess insulation layer and in the second recess so that a gate region is formed when the second recess is filled with the conductive material;

removing a sufficient amount of the insulator, the recess insulation layer and the conductive material so that top surfaces of the insulator, the conductive material and the substrate are substantially at the same level.

2. A method according to claim 1 wherein the step of forming the first recess comprises:

etching the substrate with a plasma of etchant gas.

3. A method according to claim 2 wherein the plasma of etchant gas comprises $Cl_2$, $CHF_3$, $CF_4$, HBr or Ar.

4. A method according to claim 1 wherein the step of forming the second recess comprises:

etching the predetermined area of the substrate with a plasma of etchant gas.

5. A method according to claim 4 wherein the plasma of etchant gas comprises $Cl_2$, $CHF_3$, $CF_4$, HBr or Ar.

6. A method according to claim 1 wherein the step of depositing the conductive material is performed by chemical vapor deposition.

7. A method according to claim 1 wherein the step of removing the sufficient amount of the insulator and the conductive material comprises the steps of:

etching the insulator and the conductive material with a plasma of etchant gas; and planarizing the top surface of the insulator and the top surface of the conductive material.

8. A method according to claim 7 wherein the plasma of etchant gas comprises $Cl_2$, $CHF_3$, $CF_4$, HBr or Ar.

9. A method according to claim 1 wherein the step of removing comprises:

performing chemical mechanical polishing on the top surface of the insulator and the top surface of the conductive material.

10. A method according to claim 9 wherein the top surface of the insulator and the top surface of the conductive material are polished concurrently.

11. A method according to claim 1 wherein the recess insulation layer comprises TEOS.

12. A method according to claim 1 further comprising:

doping the gate region and at least one source/drain region near the gate region after the removing step.

13. A method according to claim 12 further comprising:

forming a contact on the source/drain region after the doping step.

14. A method of forming a semiconductor device on a substrate having a top surface, comprising the steps of:

forming an isolation region containing an insulator in the substrate and a recessed conductor insulated from and disposed within the substrate, said step of forming leaving residual materials disposed above said substrate;

removing said residual materials so that said insulator and said conductor are substantially aligned with the top surface of the substrate;

wherein said step of forming an isolation region includes the steps of:

forming a protective layer on the top surface of the substrate;

forming a first recess in a first predetermined region of the substrate including removing the protective layer above the first predetermined region of the substrate;

forming the isolation region insulator above the protective layer and in the first recess so that a top portion of the isolation region insulator is formed at least up to a level aligned with the top surface of the substrate;

forming a second recess in a second predetermined region of the substrate including removing the protective layer and the isolation region insulator above the second predetermined region of the substrate;

forming a recess insulation layer above the insulator and on the surface of the second recess;

forming a conductive material on the recess insulation layer and in the second recess so that a top portion of the conductive material is formed at least up to a level aligned with the top surface of the substrate; and wherein the step of removing removes a sufficient amount of the isolation region insulator, the recess insulation layer and the conductive material so that their remains a top surface of the insulator and a top surface of the conductive material that are substantially aligned with the top surface of the substrate.

15. A method according to claim 14 wherein the step of forming the first recess comprises:

etching the substrate and the protective layer with a plasma of etchant gas.

16. A method according to claim 15 wherein the plasma of etchant gas comprises $Cl_2$, $CHF_3$, $CF_4$, HBr or Ar.

17. A method according to claim 14 wherein the step of forming the second recess comprises:

etching the substrate, the protective layer and the insulator with a plasma of etchant gas.

18. A method according to claim 17 wherein the plasma of etchant gas comprises.

19. A method according to claim 14 wherein the step of removing the sufficient amount of the insulator and the conductive material comprises the steps of:

etching the insulator and the conductive material with a plasma of etchant gas; and planarizing the top surface of the insulator and the top surface of the conductive material.

20. A method according to claim 19 wherein the plasma of etchant gas comprises $Cl_2$, $CHF_3$, $CF_4$, HBr or Ar.

21. A method according to claim 20 wherein step of planarizing comprises:

performing chemical mechanical polishing on the top surfaces of the insulator and the conductive material.

22. A method according to claim 14 further comprising:

doping the conductive material in the second recess and a predetermined region in the substrate near the second recess after the step of planarizing.

23. A method according to claim 14 further comprising:

removing the protective layer after the step of planarizing.

24. A method of forming an electrical device on an active area of a substrate having a top surface, the active area being within an isolation region in the substrate, the isolation region containing an insulator disposed over the substrate, the method comprising the steps of:

etching a trench in a predetermined area in the substrate within the isolation region to remove a portion of the substrate and a portion of the insulator disposed over the predetermined area of the substrate;

forming an insulating layer on the surface of the substrate and in the trench;

forming a conductive layer on top of the insulating layer and in the trench so that a top portion of the conductive layer is formed at least up to a level aligned with the top surface of the substrate; and removing a sufficient amount of the insulator, the insulating layer and the conductive layer so that the top surface of the conductive layer is at a level that is substantially aligned with the top surface of the substrate and the isolation region.

25. A method according to claim 24 wherein the step of etching the trench comprises:

using a plasma of Cl2 or HBr gas to etch the trench.

26. A method according to claim 24 wherein the step of removing the sufficient amount of the insulator and the conductive layer comprises the steps of:

etching the insulator and the conductive layer with a plasma of etchant gas; and planarizing the top surface of the insulator and the top surface of the conductive layer.

27. A method according to claim 26 wherein the plasma of etchant gas comprises $Cl_2$, $CHF_3$, $CF_4$, HBr or Ar.

28. A method according to claim 26 wherein the step of planarizing comprises:

performing chemical mechanical polishing on the top surfaces of the insulator and the conductive layer.

* * * * *